United States Patent [19]

Komatsu et al.

[11] 4,028,649
[45] June 7, 1977

[54] SURFACE ACOUSTIC WAVE FILTER

[75] Inventors: Yasutoshi Komatsu, Ayasemachi; Yuzuru Yanagisawa, Fujisawa, both of Japan

[73] Assignee: Sony Corporation, Tokyo, Japan

[22] Filed: Dec. 19, 1975

[21] Appl. No.: 642,345

[30] Foreign Application Priority Data

Dec. 25, 1974 Japan .............................. 50-3867
July 24, 1975 Japan .............................. 50-90641

[52] U.S. Cl. .................................. 333/72; 310/8.2; 310/9.8; 333/30 R
[51] Int. Cl.² .................... H03H 9/04; H03H 9/26; H03H 9/32; H01L 41/10
[58] Field of Search ........................ 333/72, 30 R; 310/8–8.2, 9.4, 9.8, 9.5

[56] References Cited

UNITED STATES PATENTS

| | | | |
|---|---|---|---|
| 3,727,718 | 4/1973 | Whitehouse | 333/30 R X |
| 3,931,597 | 1/1976 | Cho et al. | 333/72 X |

*Primary Examiner*—Alfred E. Smith
*Assistant Examiner*—Marvin Nussbaum
*Attorney, Agent, or Firm*—Lewis H. Eslinger; Alvin Sinderbrand

[57] ABSTRACT

A surface acoustic wave filter having a piezo-electric substrate with a major surface and input and output transducers, each haing a plurality of finger electrodes formed on the major surface to define a propagation path for surface acoustic waves. Finger electrodes of one of the transducers have a step-like configuration to divide the surface wave propagation path into a plurality of surface wave propagation channels. The phase differences of the channels and the length of the steps of the finger electrodes are selected to minimize the multiple reflection echo between the input and output transducers to reduce ripples in the pass band.

6 Claims, 4 Drawing Figures

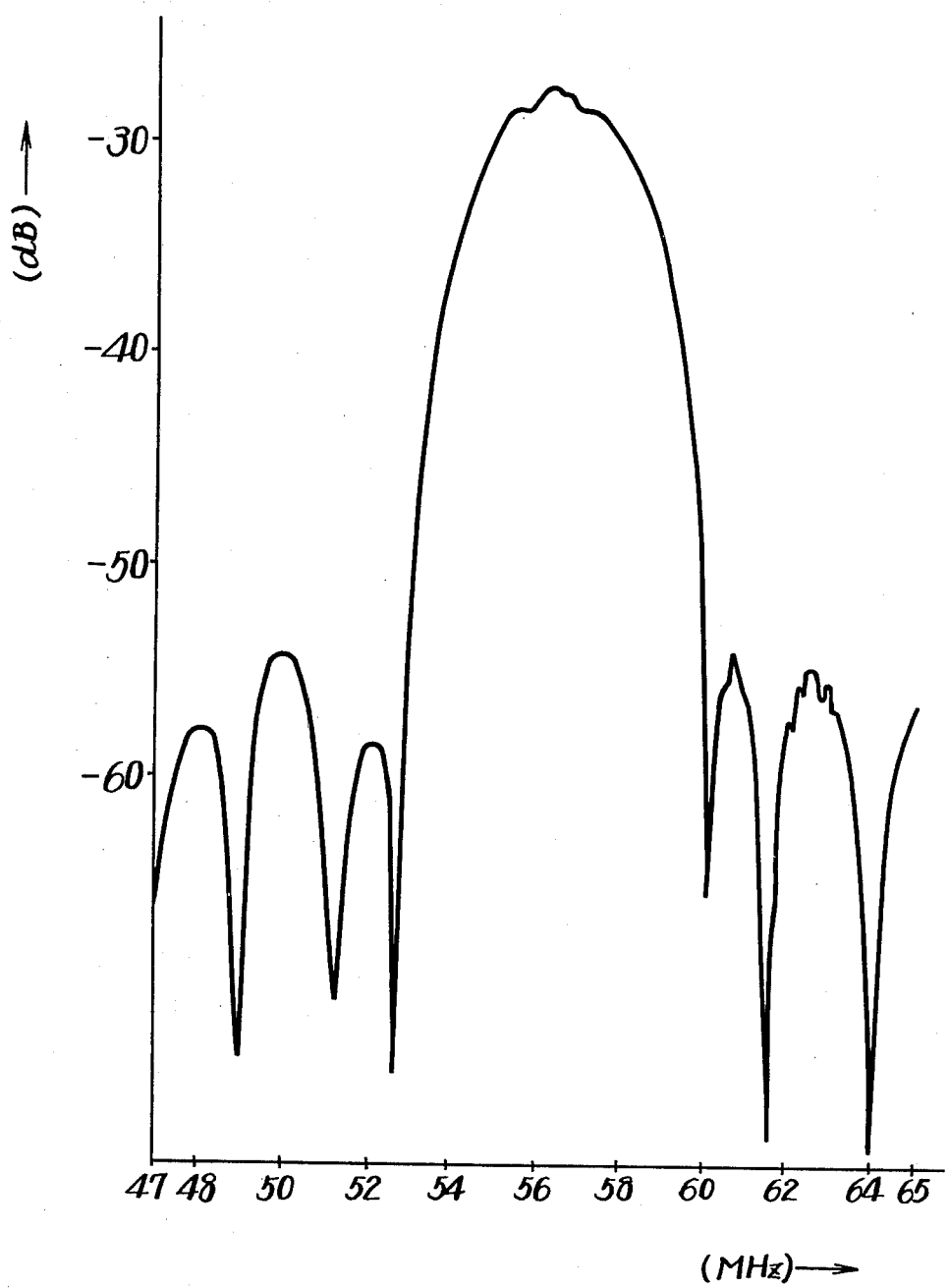

SURFACE ACOUSTIC WAVE FILTER

BACKGROUND OF THE INVENTION

1. Field of the Invention

This invention relates generally to a surface acoustic wave filter device, and is directed more particularly to a surface acoustic wave filter device in which ripples in the pass band are suppressed by means of a step type transducer.

2. Description of the Prior Art

In general, a surface acoustic wave filter device can produce a coherent ultrasonic wave and detect the same by an interdigital transducer of the transversal type. This device may be used as a linear phase band pass filter or a low ripple band pass filter which serves as band pass filter for an intermediate frequency signal in an FM radio receiver or as a band pass filter for a video intermediate frequency signal in a television receiver. From a practical point of view, however, various echo components occurring therein become obstacles and hence cause ripples in the frequency characteristics and phase characteristics in the pass band. Distortion in phase is essentially due to multiple reflection echos between inputs and outputs of the surface acoustic wave filter.

There are two components in the reflection echo of the surface acoustic wave on the interdigital transducer. One of the components is an electrical reflection due to acousto-electric regeneration from a terminal load, and the other component is a mechanical reflection due to the acoustic wave impedance mismatch between metallized and unmetallized sections of the transducer.

In order to cancel such a multiple reflection echo, the finger electrodes of an interdigital transducer are divided into a plurality of electrode elements or transducer elements in the beam width direction, which is the direction perpendicular to the beam propagation direction of a surface acoustic wave, to form a plurality of surface acoustic wave propagation channels resulting in a phase difference $\Delta\theta$ between adjacent channels. Accordingly, the echo, caused by the mechanical reflection due to the acoustic impedance mismatch between metallized and unmetallized sections of the transducer is suppressed (refer to the gazette of the Japanese Patent Application laid open No. 107156/1974).

With this prior method, one of the echo components can be suppressed, but other echo components cannot be suppressed and hence the multiple reflection echo can not be suppressed sufficiently. As a result, ripples appear in the frequency and phase characteristics of the pass band, and hence such a prior art method is not practical.

OBJECTS AND SUMMARY OF THE INVENTION

Accordingly, it is an object of the present invention to provide an improved surface acoustic wave filter.

It is another object of the invention to provide a surface acoustic wave filter in which ripples in the pass band are suppressed.

According to one embodiment of the present invention there is provided a surface acoustic wave filter which comprises a piezo-electric substrate having a major surface and input and output transducers formed on the major surface and each consisting of a plurality of transducer elements. A plurality of surface acoustic wave propagation channels are formed on the substrate between the input and output transducers, the width of a channel $k$ being taken as $W_k$, and the phase difference between the channel $k$ and $n$ times the wave length at the center frequency of the surface acoustic wave filter being represented by $\theta_k$ ($n$ being a positive integer), the values of $\theta_k$ and $W_k$ being selected to satisfy the following condition $$\frac{|RR'(\Sigma_k W_k e^{j n \theta_k}) + (RQ' + R'Q)(\Sigma_k W_k e^{j n \theta_k})(\Sigma_k W_k e^{j \theta_l}) + QQ'(\Sigma_k W_k e^{j \theta_k})^3|}{|\Sigma_k W_k e^{j \theta_k}|} < 10^{-2}$$

where R and R' are mechanical reflection coefficients of the input and output transducers, Q and Q' are electrical reflection coefficients of the input and output transducers, and $\Sigma_k W_k$ is normalized so that $\Sigma_k W_k = 1$. The transducer elements of the input transducer are located close together and are electrically connected, the transducer elements of the output transducer located close together and are electrically connected, and the plurality of surface acoustic wave propagation channels are formed without any overlapping areas.

The additional and other objects, features and advantages of the present invention will become apparent from the following description taken in conjunction with the accompanying drawings.

BRIEF DESCRIPTION OF THE DRAWINGS

FIG. 4 is a graph showing the frequency response characteristics of the surface acoustic wave filter shown in FIG. 3.

DESCRIPTION OF THE PREFERRED EMBODIMENTS

Figure 1:
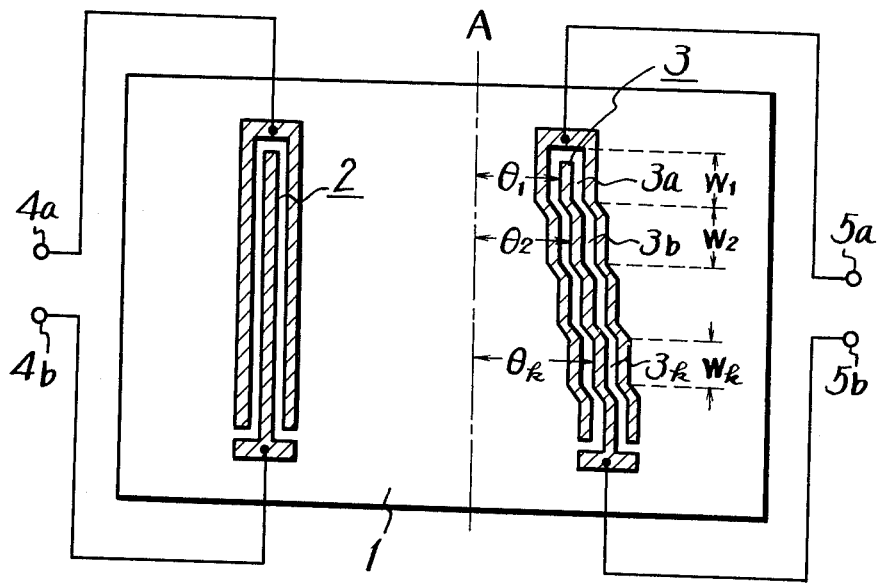
FIG. 1 is a schematic diagram of a surface acoustic wave filter for explaining the present invention.

In FIG. 1, a piezo-electric substrate 1 has a major surface and is made of a material such as lead zirconate titanate ceramics (PZT), lithium niobate $LiNbO_3$) or bismuth germanium oxide ($Bi_{12}GeO_{20}$), for example. On the major surface of the piezo-electric substrate 1 are located two interdigital transducers 2 and 3 spaced a predetermined distance apart in opposed relation. Each of the interdigital transducers 2 and 3 consists of a plurality of transducer elements. In this case, the arranging pitch of the stripes of the interdigital transducers 2 and 3 is determined according to the center frequency $f_0$ of the frequency band for which the filter is to be used. One of the interdigital transducers, in this example the interdigital transducer 3, is divided in the beam width direction of the surface acoustic wave into a plurality of transducer elements to form a plurality of surface acoustic wave propagation channels $3a, 3b, \ldots 3k, \ldots$. The lengths of the electrodes of the plurality of transducer elements corresponding to the respective surface acoustic wave propagation channels 3a, 3b, . . . 3k, . . ., i.e. the widths of the channels are designated as $W_1, W_2, \ldots W_k, \ldots$. The phase shifts or deviations of the electrodes of the respective surface acoustic wave propagation channels 3a, 3b, . . . 3k, . . . from a reference line A, which is parallel to the interdigital transducer 2, are taken as $\theta_1, \theta_2, \ldots \theta_k, \ldots$. In this case, the phase shifts $\theta_1, \theta_2, \ldots \theta_k, \ldots$ are equal to the phase differences between the lengths of the respective channels and the $n$th wavelength ($n$ being a positive integer) at the center frequency in the resonance state. The mechanical reflection coefficients due to the acoustic impedance mismatch between metallized and unmetallized sections of the transducers 3 and 2 are designated as R and R', respectively, and the electrical reflection coefficients due to the electro-mechanical regeneration of the transducers 3 and 2 are designated as Q and Q', respectively. The multiple reflection echo E (triple transit echo) may be expressed as follows:

$$E = B \, [RR'(\Sigma_k W_k e^{j3\theta_k}) + (R'Q + RQ') \cdot (\Sigma_k W_k e^{j2\theta_k})(\Sigma_k W_k e^{j\theta_k}) + QQ'(\Sigma_k W_k e^{j\theta_k})^3] \quad (1)$$

where B represents a constant.

In FIG. 1, reference numerals 4a and 4b designate input terminals, and reference numerals 5a and 5b designate output terminals.

An embodiment of a surface acoustic wave filter according to the present invention will now be described with reference to FIG. 2 in which parts corresponding to those of FIG. 1 are marked with the corresponding reference numerals and letters.

Figure 2:
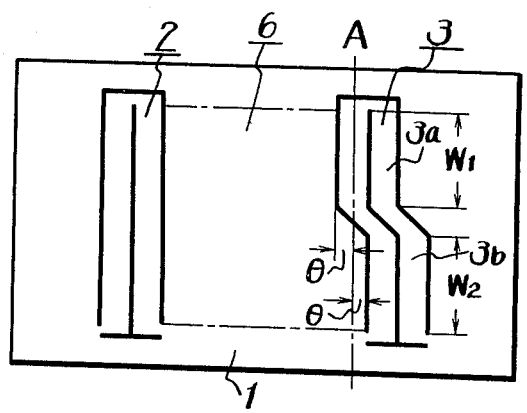
FIG. 2 is a schematic plan view showing an embodiment of a surface acoustic wave filter according to the present invention.

In the embodiment of FIG. 2, lithium niobate (LiNbO$_3$) is employed as the piezo-electric substrate 1 with a y-cut, z-direction propagation (the surface is perpendicular to the y-axis, and the direction of the surface acoustic wave propagation is parallel to the z-axis). In this case, the effective electro-mechanical coupling coefficient is taken as 4.5%. In this embodiment, an interdigital transducer 2 is provided with 15 finger-shaped electrode pairs. An interdigital transducer 3 is provided with 11 finger-shaped electrode pairs. The width of the finger-shaped electrodes is selected to be equal to the distance between adjacent electrodes. Between the transducers 2 and 3 a surface acoustic wave propagation channel 6 is formed on the substrate 1. The interdigital transducer 3 is also divided into two transducer elements to form two surface acoustic wave propagation channels 3a and 3b. In this case, the phase shifts $\theta_1$ and $\theta_2$ of the finger-shaped electrodes of the surface acoustic wave propagation channels 3a and 3b from the reference line A are selected as $-\theta$ and $\theta$ ($\theta_1 = -\theta$, $\theta_2 = \theta$), respectively, where the reference line A is the center line between the finger-shaped electrodes of the surface acoustic wave propagation channels 3a and 3b, and the lengths of the finger-shaped electrodes are selected as $W_1$ and $W_2$ ($W_1 \neq W_2$), respectively. In this case, if $W_1$ and $W_2$ are normalized so that $W_1 + W_2 = 1$, $W_1$ and $W_2$ can be expressed as follows:

$$W_1 = \sin^2 \phi/2$$

$$W_2 = \cos^2 \phi/2$$

In this case, the main signal $S_M$ is expressed as follows:

$$S_M = B \, (\Sigma_k W_k e^{j\theta_k})$$

$$= B \, (\cos\theta + i \cos\phi \sin\theta)$$

The multiple reflection or triple transit echo E is expressed as follows:

$$E = B \, [RR'(\Sigma_k W_k e^{j3\theta_k}) + (R'Q + RQ') \\ (\Sigma_k W_k e^{j2\theta_k})(\Sigma_k W_k e^{j\theta_k}) + QQ'(\Sigma_k W_k e^{j\theta_k})^3]$$

$$= B[RR'(\cos 3\theta + i \cos\phi \sin 3\theta) + (RQ' + R'Q) \cdot (\cos 2\theta + i \cos\phi \sin 2\theta)(\cos\theta + i \cos\phi \sin\theta) + QQ'(\cos\theta + i \cos\phi \sin\theta)^3]$$

In this case, the mechanical reflection coefficient R due to the acoustic impedance mismatch between metallized and unmetallized sections of the transducer is expressed as follows:

$$R = i \tan h \, (N\psi)$$

where $N$ represents the number of finger-shaped electrode pairs of the interdigital transducer, and $\psi$ is the angle in the expression for the reflection coefficient of the surface acoustic wave due to the acoustic impedance mismatch for each of the finger-shaped electrode pairs of the interdigital transducer, $i \sin \psi$ and its transmission coefficient $\cos \psi$ and is determined by the substance, the surface direction of the substrate and surface acoustic wave propagation direction, respectively.

The electrical reflection coefficient Q due to the electromechanical regeneration is expressed by the following equation when it is assumed that the conversion efficiency from the surface acoustic wave to the electrical signal is designated as L, the conversion efficiency from the electrical signal to the surface acoustic wave is designated as M, the admittance of the transducer is expressed as $Yin = Gin + j \, Bin$, and the admittance of a load is expressed as $Yex = Gex + j \, Bex$, respectively;

$$Q = -\frac{LM}{Yin + Yex}$$

In the resonance state at the center frequency, $Yin^* = Yex$ (where $Yin^*$ is the complex conjugate of $Yex$), so that the electrical reflection coefficient Q is expressed as follows:

$$Q = -\frac{1 + i \sin h \, (N\psi)}{2 \cos h \, (N\psi)}$$

In the present invention, the ratio of E to $S_M$ (E/$S_M$) based upon the above equation can be expressed as follows:

$$\frac{E}{S_M} = \frac{|RR'(\Sigma_k W_k e^{j3\theta_k}) + (R'Q + RQ')(\Sigma_k W_k e^{j2\theta_k})(\Sigma_k W_k e^{j\theta_k}) + QQ'(\Sigma_k W_k e^{j\theta_k})^3|}{|\Sigma_k W_k e^{j\theta_k}|}$$

$$= \frac{|RR' (\cos 3\theta + i \cos \phi \sin 3\theta) + (RQ' + R'Q)(\cos 2\theta + i \cos \phi \sin 2\theta)(\cos \theta + i \cos \phi \sin \theta) + QQ'(\cos \theta + i \cos \phi \sin \theta)^3|}{|(\cos \theta + i \cos \phi \sin \theta)|}$$

When the values of $\phi$ and $\theta$, which would minimize the above ratio of E to $S_M$, are obtained empirically, $\phi = 2.26$ and $\theta = 0.819 \approx 45°$ as $E/S_M = 0.37 \times 10^{-2}$ in the embodiment of FIG. 2, so that $W_1 : W_2 = 0.85 : 0.15$.

In fact, if the following condition is satisfied, such a filter can be used practically.

$$E/S_M < 10^{-2}$$

As described above, according to the present invention, a surface acoustic wave filter, which can suppress the multiple reflection or triple transit echo E to such an extent that the ratio $E/S_M$ is smaller than $10^{-2}$, is obtained. In other words, a surface acoustic wave filter, which can suppress surface acoustic wave echos caused by both mechanical and electrical reflection, is obtained.

In the embodiment of the invention shown in FIG. 2, the interdigital transducer 3 is divided into two transducer elements to form two surface acoustic wave propagation channels 3a and 3b, but it will be easily understood that even when the interdigital transducer 3 is divided into more than three transducer elements to form more than three surface acoustic wave propagation channels, the same effects can be performed.

Furthermore, when the surface acoustic wave filter of the invention is used as a delay element, the multiple reflection echo can be suppressed effectively.

It is also possible that the input and output transducers, which form a plurality of surface acoustic wave propagation channels, may be arranged close to each other to form the propagation channels separately but in parallel with one another and the electrodes of the respective input and output transducer elements may be electrically connected.

Figure 3:
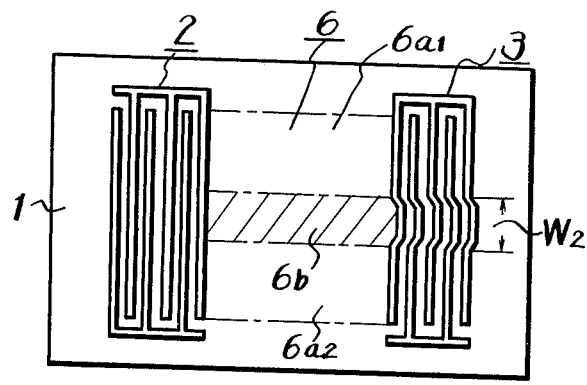
FIG. 3 is a schematic plan view showing another embodiment of a surface acoustic wave filter according to the present invention.

FIG. 3 shows another embodiment of the present invention in which the reference numerals similar to those used in FIGS. 1 and 2 designate similar elements.

In the embodiment of FIG. 3, the surface acoustic wave propagation channel 6 is divided into three channels 6b, 6a₁ and 6a₂ which are selected to have different widths, and the surface acoustic wave propagation channel 6b which has the smallest width is located away from the sides of the surface acoustic wave propagation channel 6. That is, in this example, the surface acoustic wave propagation channel 6b having the smallest width is located along the center of the channel 6 and surface acoustic wave propagation channels 6a₁ and 6a₂, which have widths wider than that of the channel 6b, are located at both sides of the center channel 6b.

In the embodiment as shown in FIG. 3, the surface acoustic wave beams produced in the center surface acoustic wave propagation channel 6b are affected by diffraction, but all the beams can be incident upon the transducer without departing from the opposed transducers. At the same time, the surface acoustic wave beams produced in the surface acoustic wave channels 6a₁ and 6a₂ of greater width are subjected to diffraction and scattering at their ends, but the energy of the diffraction and scattering is small as compared with the total energy of the channels 6a₁ and 6a₂. Therefore, the diffraction and scattering energy does not affect performance significantly.

For this reason, the embodiment of FIG. 3 can suppress the multiple reflection echo more effectively and hence it is apparent that the phase can be compensated more effectively.

FIG. 4 is a graph showing the frequency characteristics of the surface acoustic wave filter of the invention as shown in FIG. 3 when $\Sigma W_k$ is normalized so that $\Sigma W_k = 1$ and the widths of the surface acoustic wave propagation channels 6a₁, 6b and 6a₂ are selected as $0.85/2$, $0.15$ and $0.85/2$, respectively.

The graph of FIG. 4 shows that the ripples are small, so that they are much reduced or improved near the center frequency of the pass band, as compared with the prior art.

In the embodiment of FIG. 3, the surface acoustic wave propagation channel is divided into three channels having different widths, and that the channels having the smallest width is located between the other two channels. However, it will be apparent that even if the surface acoustic wave propagation channel is divided into more than three channels of different widths, the same effect can be achieved by locating the channel of the smallest width at a position removed from the sides of the surface acoustic wave propagation channel.

It will be apparent that many modifications and variations in the embodiments shown could be made by one skilled in the art without departing from the true scope of the novel concepts of the present invention, so that the true scope of the invention should be determined by the following claims.

We claim as our invention:
1. A surface acoustic wave filter comprising:
   a. a piezo-electric substrate having a major surface;
   b. input and output transducers formed on the major surface of said substrate, each of said transducer consisting of a plurality of transducer elements; and
   c. a plurality of surface acoustic wave propagation channels formed on said substrate between said input and output transducer; in which, when the width of a channel $k$ is taken as $W_k$, and the phase difference between the length of the channel $k$ and $n$ times the wave length at the center frequency is taken as $\theta_k$ ($n$ being a positive integer), the values of $\theta_k$ and $W_k$ are selected to satisfy the following condition:

$$\frac{|RR'(\Sigma_k W_k e^{j3\theta_k}) + (RQ' + R'Q)(\Sigma_k W_k e^{j2\theta_k})(\Sigma_k W_k e^{j\theta_k}) + QQ'(\Sigma_k W_k e^{j\theta_k})^3|}{|\Sigma_k W_k e^{j\theta_k}|} < 10^{-2}$$

where R and R' are, respectively, mechanical reflection coefficients of said input and output transducers, Q and Q' are, respectively, electrical reflection coefficients of said input and output transducers, and $\Sigma_k W_k$ is normalized as $\Sigma_k W_k = 1$, the transducer elements of said input transducer being located close together and electrically connected, and said plurality of surface acoustic wave propagation channels being formed without an overlapping area.

2. A surface acoustic wave filter as claimed in claim 1, in which said input and output transducers are formed integrally and at least one of them has a step type configuration.

3. A surface acoustic wave filter as claimed in claim 2, in which the channel having the smallest width $W_k$ is located in the surface acoustic wave propagation channel in a position removed from the sides thereof.

4. A surface acoustic wave filter as claimed in claim 1, in which said piezo-electric substrate comprises a lithium niobate single crystal of y cut and Z direction propagation.

5. A surface acoustic wave filter as claimed in claim 1, in which each of said input and output transducers includes two pairs of transducer elements.

6. A surface acoustic wave filter as claimed in claim 5, in which said transducer elements are made such that said phase difference satisfies $\theta \approx 45°$ and the widths $W_1$ and $W_2$ of said two channels satisfy $W_1 : W_2 \approx 0.85 : 0.15$, respectively.

* * * * *